(12) United States Patent
Tan

(10) Patent No.: US 7,400,036 B2
(45) Date of Patent: Jul. 15, 2008

(54) SEMICONDUCTOR CHIP PACKAGE WITH A PACKAGE SUBSTRATE AND A LID COVER

(75) Inventor: Say Leong Tan, Perak (MY)

(73) Assignee: Avago Technologies General IP Pte Ltd, Singapore (SG)

( * ) Notice: Subject to any disclaimer, the term of this patent is extended or adjusted under 35 U.S.C. 154(b) by 368 days.

(21) Appl. No.: 10/320,905

(22) Filed: Dec. 16, 2002

(65) Prior Publication Data

US 2004/0113251 A1 Jun. 17, 2004

(51) Int. Cl.
*H01L 23/12* (2006.01)
*H01L 23/48* (2006.01)

(52) U.S. Cl. .................. 257/704; 257/692; 257/778; 257/784

(58) Field of Classification Search .............. 257/687, 257/688, 690, 692, 693, 704, 705, 710, 737, 257/738, 778–780, 784; 438/125–127, 613
See application file for complete search history.

(56) References Cited

U.S. PATENT DOCUMENTS

| | | | |
|---|---|---|---|
| 5,608,262 A * | 3/1997 | Degani et al. | ............... 257/723 |
| 6,084,297 A | 7/2000 | Brooks et al. | |
| 6,166,435 A | 12/2000 | Leu et al. | |
| 6,294,839 B1 * | 9/2001 | Mess et al. | ................... 257/777 |

\* cited by examiner

*Primary Examiner*—Hung Vu

(57) ABSTRACT

A semiconductor chip package includes a package substrate having a first bond pad pattern. A semiconductor chip resides on the package substrate. The semiconductor chip has a second bond pad pattern. A lid cover houses the semiconductor chip and is fitted onto the package substrate. The second bond pattern of the semiconductor chip is connected to the first bond pattern of the package substrate through internal conductor traces of the lid cover.

17 Claims, 2 Drawing Sheets

SEMICONDUCTOR CHIP PACKAGE WITH A PACKAGE SUBSTRATE AND A LID COVER

BACKGROUND OF THE INVENTION

1. Field of the Invention

The present invention relates to semiconductor chip packages. Particularly, the present invention is related to a semiconductor chip package with a package substrate and a lid cover.

2. Description of the Related Art

Surface mount technology (SMT), where semiconductor chips with their connection pads at the bottom surface of the chips are mounted directly onto a surface without being plugged into it, is widely used in electronic applications. Another known semiconductor chip mounting technique is referred to as the Flip-Chip mounting technique. Using this technique, a semiconductor chip having a bottom bond pad pattern is mounted with its face down directly onto a corresponding bond pad pattern of a circuit board in a manner similar to the SMT process.

Semiconductor packages are used for protecting a semiconductor chip or die in a package body, and for providing connection points for connecting the packaged chip or die to the semiconductor chip or die to external devices. To cope with the high density and high pin-count of semiconductor chips, BGA (Ball Grid Array) and PGA (Pin Grid Array) packages have been developed.

In a typical BGA package, the semiconductor chip is mounted to the top surface of a package substrate or printed circuit board-type substrate. The chip is wire bonded to electrical traces in the substrate, then over-molded with an encapsulating material for protection. Solder balls are bonded to the electrical traces on the bottom surface of the substrate, serving as the external electrodes for mounting on a printed circuit board. Again, this type of package is suitable to be mounted using the Flip-Chip or SMT technique. Other BGA type semiconductor chip packages are known where the semiconductor chip is connected to a bottom ball pad pattern through gold wires connected to an internal wiring leading through a multi-layer substrate.

Disadvanges are associated with the prior BGA packages. One disadvantage is that the chips are subject to damages because their top surfaces are exposed during testing or packaging steps. Another disadvantage is that the prior BGA packages require wires for connection between the chip and substrate.

SUMMARY OF THE INVENTION

One of the features of the present invention is to provide a semiconductor chip package adapted for face down mounting on circuit boards.

Another feature of the present invention is to provide a wireless semiconductor chip package with increased versatility.

In accordance with one embodiment of the present invention, a semiconductor chip package is provided. The package includes a package substrate having a first bond pad pattern. A semiconductor chip is attached to the package substrate and has a second bond pad pattern. A lid cover houses the semiconductor chip and is fitted onto the package substrate. The bond pad pattern of the semiconductor chip is connected to the bond pad pattern of the package substrate through internal conductor traces of the lid cover.

This makes the package a wireless semiconductor chip package. Moreover, the semiconductor chip is attached to the top of the package substrate by an intermediate resin layer, and may be within the lid cover by an air gap between the top plate of the lid cover and the package substrate.

DETAILED DESCRIPTION OF THE INVENTION

Figure 5:
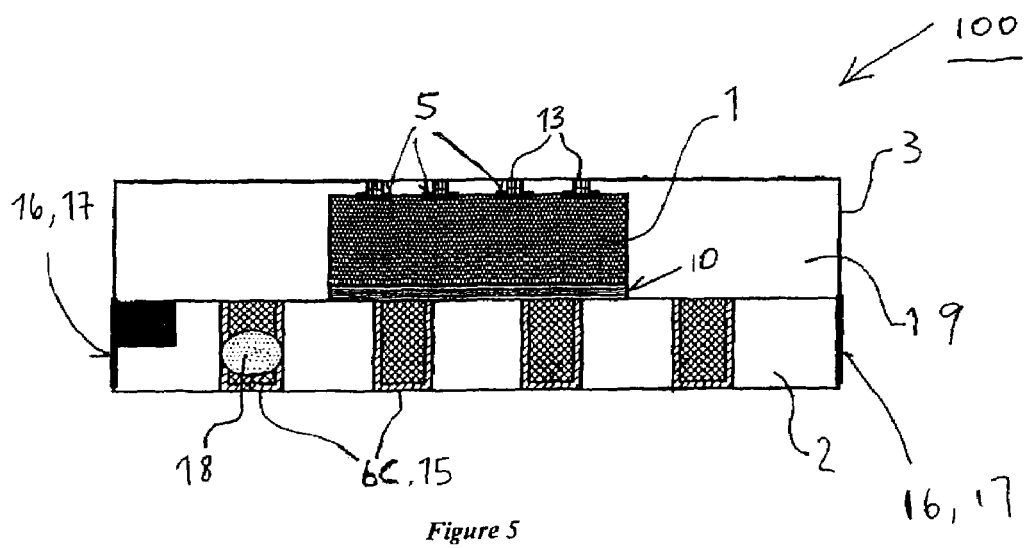
FIG. 5 is a schematic side view of a wireless communication semiconductor chip package assembly of the semiconductor chip, package substrate, and lid cover shown in FIGS. 1 to 4.

FIG. 5 shows a side view of a semiconductor chip package 100 in accordance with one embodiment of the present invention. As will be described in more detail below, the semiconductor chip package 100 is a wireless semiconductor chip package. This means that the package 100 is without connecting and self-supported wires. The semiconductor chip 1 can also be referred to as a semiconductor (or IC) chip or die.

The semiconductor chip package 100 includes a semiconductor chip 1. The semiconductor chip 1 has a top bond pad pattern 5. The semiconductor chip 1 is housed between a package substrate 2 and a lid cover 3. The lid cover 3 is fitted onto the package substrate 2. The lid cover 3 is internally plated with a bottom bond pad pattern 13 corresponding to and in contact with the top bond pad pattern 5 of the semiconductor chip 1 and provides internal conductor traces to electrically connect the semiconductor chip 1 to a bottom bond pad pattern 6 of the package substrate 2.

This makes the semiconductor chip package 100 a wireless semiconductor chip package. Moreover, the semiconductor chip 1 is attached to the top of the package substrate 2 by an intermediate resin layer 10, and may be within the lid cover 3 by an air gap 19 between a top plate (i.e., the top plate 11 in FIG. 3) of the lid cover 3 and the package substrate 2.

This allows the wireless semiconductor chip package 100 to be adapted for face down mounting on circuit boards. This also allows the wireless semiconductor chip package 100 with increased versatility by having its semiconductor chip housed in a lid cover and surrounded by an air gap for thermal insulation purposes. The wireless semiconductor chip package 100 will be described in more detail below, also in conjunction with FIGS. 1-5.

Figure 1:
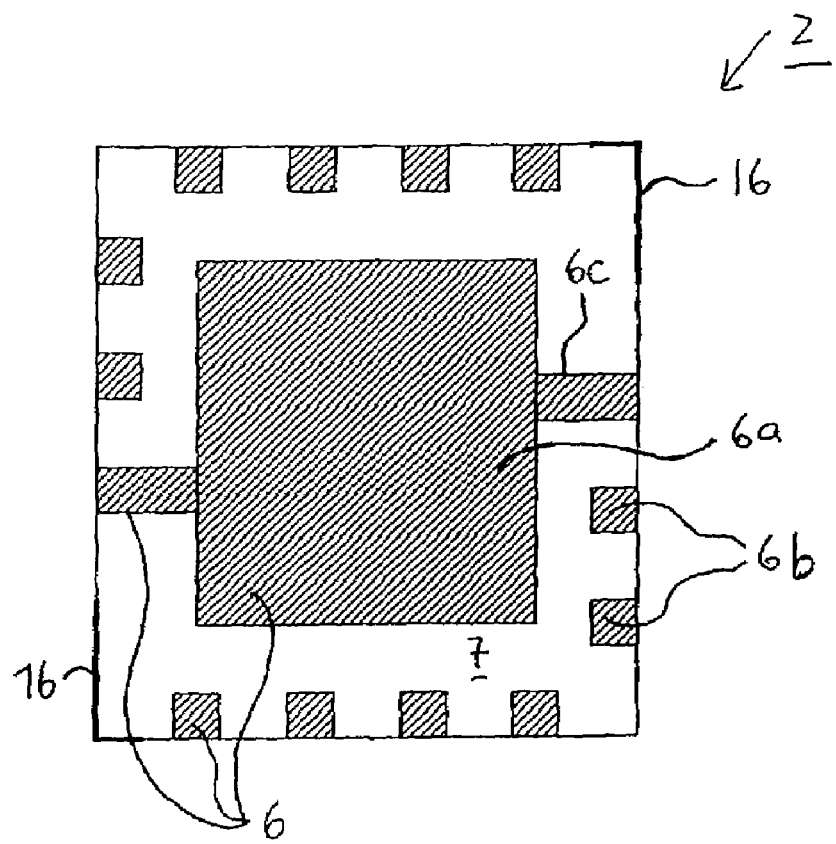
FIG. 1 is a bottom view of a package substrate of the semiconductor chip package in accordance with one embodiment of the present invention.
Figure 2:
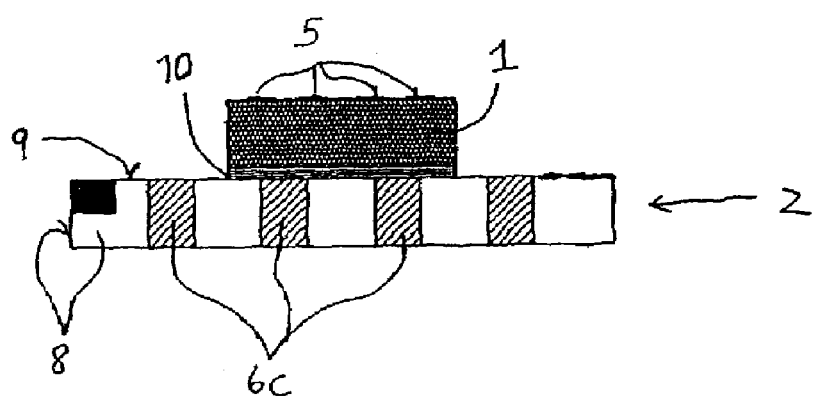
FIG. 2 is a side view of the package substrate of FIG. 1 with a semiconductor chip attached on top of the package substrate.

The package substrate 2 is shown in more detail in FIGS. 1 and 2. The package substrate 2 is made of a non-conductive material like ceramics or that of a printed circuit board (PCB). The bottom surface 7 of the package substrate 2 is plated with a conductive material (e.g. Au/Ni/CU metal for PCB substrate) to form conductive traces of a bottom bond pad pattern 6. The bottom bond pad pattern 6 includes a ground pad 6a, a plurality of input/output pads 6b, and a plurality of lead-out conductive traces 6c (see FIG. 2) connected to the pads 6a and 6b and extending up to and across the side surfaces 8 of the package substrate 2 as further shown in FIG. 2. The plating material is chosen for electrical connection and solderability.

As can be seen from FIG. 2, the package substrate 2 prepared in the aforementioned manner then receives a resin, preferably an epoxy resin. The resin is placed onto the middle portion of the top surface 9 of the package substrate 2 to form a resin layer 10 for heat dissipation and for attaching the semiconductor chip 1. The process for attaching the semiconductor chip 1 can be a stencil printing or, for example, an eutectic or a stamping or a dispensing process. When forming the resin layer 10, the thickness of the resin layer 10 should be controlled tightly, and all the aforementioned processes are suitable for a good resin thickness control. The semiconductor chip 1 is then placed onto the resin layer 10, thereby firmly attaching the semiconductor chip 1 on the package substrate 2. At this time, the top bond pad pattern 5 of the semiconductor chip 1 is not in contact with the resin layer 10, but rather is on the opposite side of the semiconductor chip 1.

Figure 3:
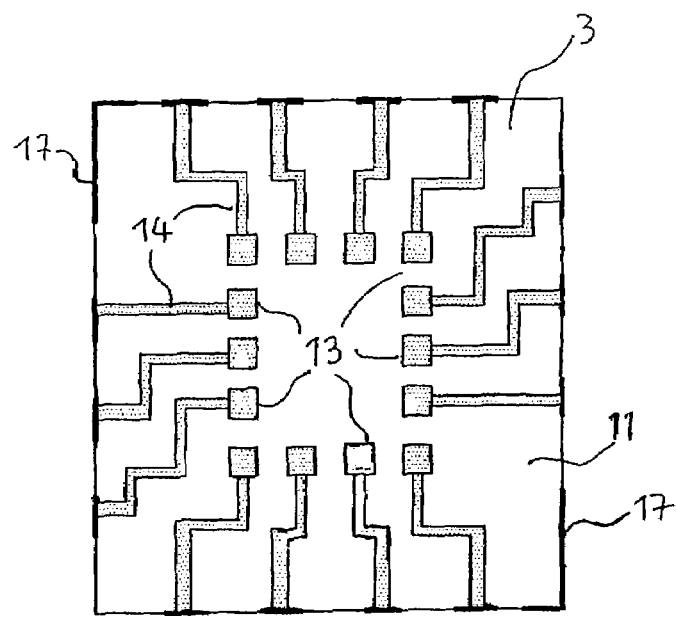
FIG. 3 is a bottom view of a lid cover to be fitted onto the package substrate of FIG. 2 thereby housing the semiconductor chip and providing electrical connection between the top bond pad pattern of the chip and the bottom bond pad pattern of the package.
Figure 4:
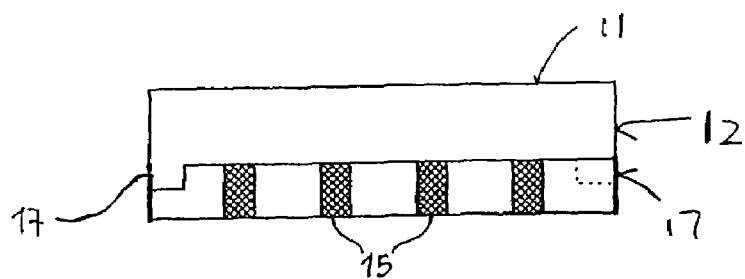
FIG. 4 is a side view of the lid cover of FIG. 3.

FIGS. 3 and 4 show a bottom view and a schematic side view, respectively, of the lid cover 3. As can be seen from FIG. 3-4, the lid cover 3 is a cup-shaped lid cover of non-conductive material. The non-conductive material can be, for example, a PCB substrate material. The lid cover 3 includes the top plate 11 and four side walls 12 projecting from the top plate 11. The inner (bottom) surface of the top plate 11 is plated with the bottom bond pad pattern 13 and a plurality of conductive traces 14 connected to the bottom bond pad pattern 13 and extending along the inner surface of the top plate 11 and down along the inner surfaces of the side walls 12 to end into side bond pads 15 at the lower edge portions of side walls 12. The plating material is a conductive and solderable metal (e.g. Au/Ni/Cu for PCB substrate material). The footprint of the bottom bond pad pattern 13 of the lid cover 3 is exactly the same as the footprint of the top bond pad pattern 5 of the seminconductor chip 1 (see FIGS. 1-2 and 5). The foot print shown is only an example for a variety of possible footprints as will be appreciated by the skilled person. The bottom bond pad pattern 13 of the lid cover 3 may even include projecting bumps of any suitable design and type.

As can be seen from FIGS. 1-5, the size and dimensions of the lid cover 3 and the package substrate 2 including their plating patterns are such that the inner sides of the side walls 12 of the lid cover 3 tightly fit into the side surfaces 8 of the package substrate 2 (see FIG. 2). When the lid cover 3 is fitted onto and around the package substrate 2, the bottom bond pad pattern 13 of the lid cover 3 is pressed into electrical contact with the top bond pad pattern 5 of the semiconductor chip 1. In addition, the side bond pads 15 of the bottom bond 5 pad pattern 13 on the inner side of the side walls 12 of the lid cover 3 are in tight contact with the conductive traces 6c on the side surfaces 8 of package substrate plate 2. Therefore, electrical connection is established between the bond pads/traces 15, 14 of the lid cover 3 and the conductive traces 6c of the bottom bond pad pattern 6.

As further shown in FIGS. 1 and 3, the package substrate 2 and the lid cover 3 additionally include guard rings 16 and 17, respectively, on diametrically opposite corners thereof. These guard rings 16, 17 are used to guide the position of lid cover 3 such that the foot print of the bottom bond pad pattern 13 of the lid cover 3 sits directly onto the same footprint of the top bond pad pattern 5 of the chip 1.

FIG. 4 shows the side view of lid cover 3 with the side bond pads 15 for the purpose of electrical connection and solderability towards the condcutive traces 6c of the bottom bond pad pattern 6 of the package substrate 2.

As further shown in FIG. 5, the lid cover 3 is finally fixed to the package substrate 2 by solder points 18 for the purpose of having the bottom bond pad pattern 13 of the lid cover 3 permanently and firmly connected to the top bond pad pattern 5 of the semiconductor chip 1. As further shown in FIG. 5, the semiconductor chip 1 is surrounded by an air gap or space 19 between the lid cover 3 and the package substrate 2. This is for thermal insulation purposes.

The present invention is not limited to what has been described above and shown in the drawings. Especially, it is possible and may be preferable, to include bumps of any suitable design into the bond pads of the bond pad patterns.

The invention claimed is:

1. A semiconductor chip package, comprising:
a package substrate having a first bond pad pattern;
a semiconductor chip on the package substrate, the semiconductor chip having a second bond pad pattern; and
a lid cover housing the semiconductor chip and being fitted onto the package substrate;
wherein the bond pattern of the semiconductor chip is connected to the bond pattern of the package substrate through internal conductor traces of the lid cover; and
wherein the semiconductor chip is attached to the top of the package substrate by an intermediate resin layer.

2. The semiconductor chip package of claim 1, wherein the semiconductor chip is surrounded within the lid cover by an air gap between a top plate of the lid cover and the package substrate.

3. The semiconductor chip package of claim 1, wherein the semiconductor chip is attached to the package substrate by a resin layer and the lid cover.

4. The semiconductor chip package of claim 3, wherein the lid cover is made of non-conductive material.

5. The semiconductor chip package of claim 4, wherein the lid cover includes a top plate and projecting side walls fitted onto the package substrate around side surfaces thereof.

6. The semiconductor chip package of claim 5, wherein the internal conductor traces include (1) an inside bottom bond pad pattern on the top plate contacting the bond pad pattern of the semiconductor chip and (2) a plurality of conductive traces which are connected to the bottom bond pad pattern of the top plate and run internally along the side walls of the lid cover to connect to the bond pad pattern of the package substrate via a plurality of conductive traces plated on side surfaces of the package substrate.

7. The semiconductor chip package of claim 6, wherein the package substrate and the side walls of the lid cover including guard rings at diametrically opposite corners thereof so as to guide the position of the bottom bond pad pattern of the lid cover to match the position of the second bond pad pattern of the semiconductor chip when the lid cover is fitted onto the package substrate.

8. The semiconductor chip package of claim 6, wherein the bond pad pattern of the package substrate is on the top surface of the package substrate, and the bond pad pattern of the semiconductor chip is on the bottom surface of the package substrate.

9. The semiconductor chip package of claim 1, wherein the semiconductor package is a wireless semiconductor package.

10. A semiconductor chip package, comprising:
a package substrate having a first bond pad pattern;
a semiconductor chip mounted to the package substrate, the semiconductor chip having a second bond pad pattern; and
a lid cover housing the semiconductor chip and being fitted onto the package substrate, said lid cover being made of a non-conductive material;

wherein the bond pattern of the semiconductor chip is connected to the bond pattern of the package substrate through internal conductor traces of the lid cover.

11. The semiconductor chip package of claim 10, wherein the semiconductor chip is attached to the top of the package substrate by an intermediate resin layer.

12. The semiconductor chip package of claim 10, wherein the semiconductor chip is surrounded within the lid cover by an air gap between a top plate of the lid cover and the package substrate.

13. The semiconductor chip package of claim 12, wherein the lid cover includes a top plate and projecting side walls fitted onto the package substrate around side surfaces thereof.

14. The semiconductor chip package of claim 13, wherein the internal conductor traces include (1) an inside bottom bond pad pattern on the top plate contacting the bond pad pattern of the semiconductor chip and (2) a plurality of conductive traces which are connected to the bottom bond pad pattern of the top plate and run internally along the side walls of the lid cover to connect to the bond pad pattern of the package substrate via a plurality of conductive traces plated on side surfaces of the package substrate.

15. The semiconductor chip package of claim 14, wherein the package substrate and the side walls of the lid cover including guard rings at diametrically opposite corners thereof so as to guide the position of the bottom bond pad pattern of the lid cover to match the position of the second bond pad pattern of the semiconductor chip when the lid cover is fitted onto the package substrate.

16. The semiconductor chip package of claim 14, wherein the bond pad pattern of the package substrate is on the top surface of the package substrate, and the bond pad pattern of the semiconductor chip is on the bottom surface of the package substrate.

17. The semiconductor chip package of claim 10, wherein the semiconductor package is a wireless semiconductor package.

* * * * *